United States Patent
Ojanen et al.

(10) Patent No.: US 8,019,294 B2
(45) Date of Patent: Sep. 13, 2011

(54) CONTROL CIRCUIT AND DITHERING METHOD

(75) Inventors: Martti Ojanen, Turku (FI); Hannu Virta, Paimio (FI)

(73) Assignee: Nokia Corporation, Espoo (FI)

( * ) Notice: Subject to any disclaimer, the term of this patent is extended or adjusted under 35 U.S.C. 154(b) by 671 days.

(21) Appl. No.: 12/153,449

(22) Filed: May 19, 2008

(65) Prior Publication Data

US 2009/0072872 A1     Mar. 19, 2009

(30) Foreign Application Priority Data

Sep. 17, 2007   (FI) ..................................... 20075645

(51) Int. Cl.
    *H04B 1/04*   (2006.01)
(52) U.S. Cl. ..................................... 455/127.1; 323/283
(58) Field of Classification Search ............ 455/91, 455/114.1–114.3, 115.1, 115.2, 121, 126, 455/127.1, 127.2; 330/129, 149, 297; 323/235, 323/282, 283
    See application file for complete search history.

(56) References Cited

U.S. PATENT DOCUMENTS

| | | | |
|---|---|---|---|
| 5,331,537 | A | 7/1994 | Skarpetowski |
| 6,188,208 | B1 | 2/2001 | Glaser et al. |
| 6,980,039 | B1 | 12/2005 | Dening et al. |
| 7,132,891 | B1 | 11/2006 | Dening et al. |
| 2002/0149351 | A1 | 10/2002 | Kanekawa et al. |
| 2003/0002299 | A1 | 1/2003 | Trzynadlowski et al. |
| 2005/0218873 | A1 | 10/2005 | Shuey et al. |
| 2005/0243894 | A1 | 11/2005 | Chen et al. |
| 2005/0270006 | A1 | 12/2005 | Chapuis |
| 2007/0047272 | A1 | 3/2007 | Kris |
| 2007/0190949 | A1* | 8/2007 | Mohindra ................ 455/91 |
| 2007/0210776 | A1 | 9/2007 | Oka |

OTHER PUBLICATIONS

Bob Bell and Grant Smith; "Designideas"; Oct. 13, 2005; pp. 99, 100, 102, 104, and 106.
National Semiconductor Corporation; "LM5020 100V Current Mode PWM Controller"; Apr. 2006; pp. 1-13.
International Search Report, PCTFI2008/050512 dated Dec. 19, 2008.

* cited by examiner

*Primary Examiner* — Thanh Le
(74) *Attorney, Agent, or Firm* — Squire, Sanders & Dempsey (US) LLP

(57) ABSTRACT

There is provided a control circuit of a switch mode power supply including a random number generator configured to form an optimized n-degree polynomial based on the minimum power-on cycle time in order to form a uniform distribution of output signals, a switch control block configured to control output signals of the switch control block such that the complementary output stages of the switch control block conduct at different times on the basis of the output signals received from the random number generator, and a dither control block configured to generate a synchronized dither current by minimizing glitches at each differential stage of a default reference current based on the output signals received from the switch control block, and to combine the generated synchronized dither current with a reference current of a voltage ramp generator.

26 Claims, 2 Drawing Sheets

CONTROL CIRCUIT AND DITHERING METHOD

FIELD OF THE INVENTION

The invention relates to a control circuit for a switch mode power supply, to a dithering method, and to a computer-readable program distribution medium.

BACKGROUND

A single switching frequency has commonly been used in power converters, which causes a switched mode power supply (SMPS) to output a periodic ripple voltage. If such an output voltage is used as a supply voltage to a saturated power amplifier, this ripple may mix with the radio frequency carrier and generate spurious side band signals. In a general case, it may already interfere at radio frequency hardware level in cellular phone transmitter applications.

In order to achieve full efficiency benefit when switched mode power supply is used but to reduce spurs in a power amplifier's output at the same time, spreading spurious energy over a wider bandwidth is a way to stay inside system specification limits. Another way is to increase switching frequency considerably but then efficiency would be inadequate because switching big power switches at a high frequency decreases efficiency (dynamic power consumption part increases in a linear manner). When a power amplifier is powered, for instance, from boosted supply voltage (boost converter's supply voltage is taken from a battery) via a controlled buck (step-down) converter, then a frequency increase is not a viable solution since any voltage increment squares power consumption. It is also possible to use external filtering to reduce ripple voltage but this is, of course, costly.

A few basic methods for achieving some sort of spreading are known. In the first method, a reference current is summed with some constant offset. This can be done via an external setting resistor, such as in a commercial chip called LM5020.

Another way is to have a very straightforward method of slowly decreasing/increasing reference current (thus frequency) having so repeated cycles over time. Yet another way is to add a low drop-out linear regulator between a battery and a power amplifier for power control. This way the ripple issues may be reduced but it, in turn, causes decreased efficiency and a shorter battery life.

In patent publications Nos. US2007/0047272 A1 and Ser. No. 11/215,622 a more trimmed versions than just decreasing/increasing a frequency are described where a set of predefined frequencies are multiplexed and selected based on a digital PWM (pulse width modulation) counter value. This is done in a microcontroller environment.

A more radio frequency hardware related setup is described in a U.S. Pat. No. 6,980,039 B1 and an application Ser. No. 10/792,486. They describe a randomized frequency control by using one or two DACs (digital-to-analogue converters) to control an amount of current flowing in a reference capacitor, a linear feedback shift register (LFSR, random number generator), a separate LFSR's oscillator circuitry, and a reference capacitor with a current flow control switch. LFSR has a lower clocking frequency than at ramp generator's output. Further, it is described how a dither current is handled by DACs in order not to generate any nonlinearity.

BRIEF DESCRIPTION

According to an aspect of the present invention, there is provided a control circuit for a switch mode power supply comprising: a random number generator configured to form an optimized n-degree polynomial based on the minimum power-on cycle time in order to form a uniform distribution of output signals; a switch control block configured to control the output signals of the switch control block such that the complementary output stages conduct at different times on the basis of the output signals received from the random number generator; and a dither control block configured to generate a synchronized dither current by minimizing glitches at each differential stage of a default reference current based on the output signals received from the switch control block, and to combine the generated synchronized dither current with a reference current of a voltage ramp generator.

According to another aspect of the present invention, there is provided a dithering method comprising: forming, by a random number generator, an optimized n-degree polynomial based on the minimum power-on cycle time in order to form a uniform distribution of output signals; controlling the output signals of a switch control block such that the complementary output stages conduct at different times on the basis of the output signals received from the random number generator; and generating, by a dither control block, a synchronized dither current by minimizing glitches at each differential stage of a default reference current based on the output signals received from the switch control block, and combining the generated synchronized dither current with a reference current of a voltage ramp generator.

According to another aspect of the present invention, there is provided a multimode mobile terminal comprising the control circuit according to claim 1.

According to another aspect of the present invention, there is provided a computer-readable program distribution medium encoding a computer program of instructions for executing a computer process, the process comprising: forming an optimized n-degree polynomial based on the minimum power-on cycle time in order to form a uniform distribution of output signals; controlling the output signals of the switch control block such that the complementary output stages conduct at different times on the basis of the output signals received from the random number generator; and generating a synchronized dither current by minimizing glitches at each differential stage of a default reference current based on the output signals received from the switch control block, and combining the generated synchronized dither current with a reference current of a voltage ramp generator.

According to another aspect of the present invention, there is provided a control circuit for a switch mode power supply comprising: random number generator means for forming an optimized n-degree polynomial based on the minimum power-on cycle time in order to form a uniform distribution of output signals; switch control means for controlling the output signals of the switch control means such that the complementary output stages conduct at different times on the basis of the output signals received from the random number generator; and dither control means for generating a synchronized dither current by minimizing glitches at each differential stage of a default reference current based on the output signals received from the switch control block, and for combining the generated synchronized dither current with a reference current of a voltage ramp generator.

BRIEF DESCRIPTION OF THE DRAWINGS

Embodiments of the present invention are described below, by way of example only, with reference to the accompanying drawings, in which.

DETAILED DESCRIPTION OF THE INVENTION

The following embodiments are exemplary. Although the specification may refer to "an", "one", or "some" embodiment(s) in several locations, this does not necessarily mean that every such reference is to the same embodiment(s), or that the feature only applies to a single embodiment. Single features of different embodiments may also be combined to provide other embodiments.

Figure 1:
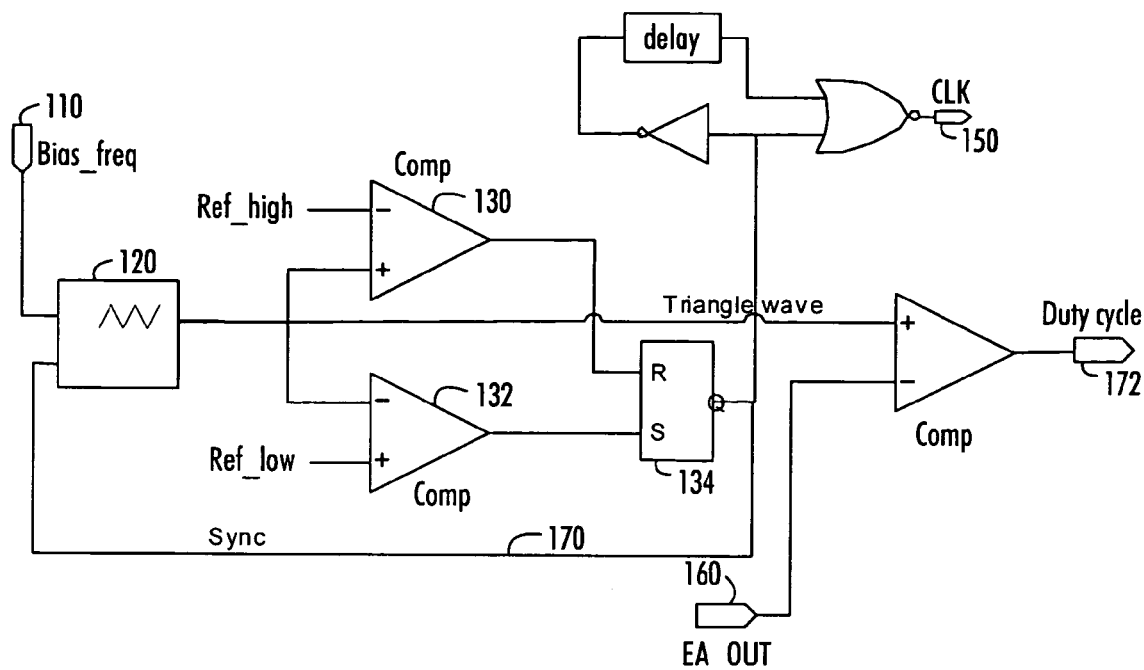
FIG. 1 is illustrates an example of a basic scenario for producing a duty cycle control.

FIG. 1 illustrates an example of a very basic scenario for producing a duty cycle 172 control. In FIG. 1, comparators 130, 132 set and reset a flip flop 134 when high (ref_high) or low (ref_low) reference voltage levels are reached at the voltage ramp generator 120 output (this can be a form of triangle wave-form, for example).

After that, a synchronizing signal (Sync) 170 is used to change the direction of the voltage ramp output, i.e. either a positive or a negative slope of the waveform is generated. This synchronizing signal 170 is also used to generate a clocking pulse 150 during the highest or lowest level at the voltage ramp generators output at the rate of programmed switching frequency (also a clocking pulse at the lowest level is possible). An EA_OUT node 160 is a control voltage from an error amplifier, which is surrounded by a compensation network and a resistor divider network from the output voltage node of the SMPS.

Figure 2:
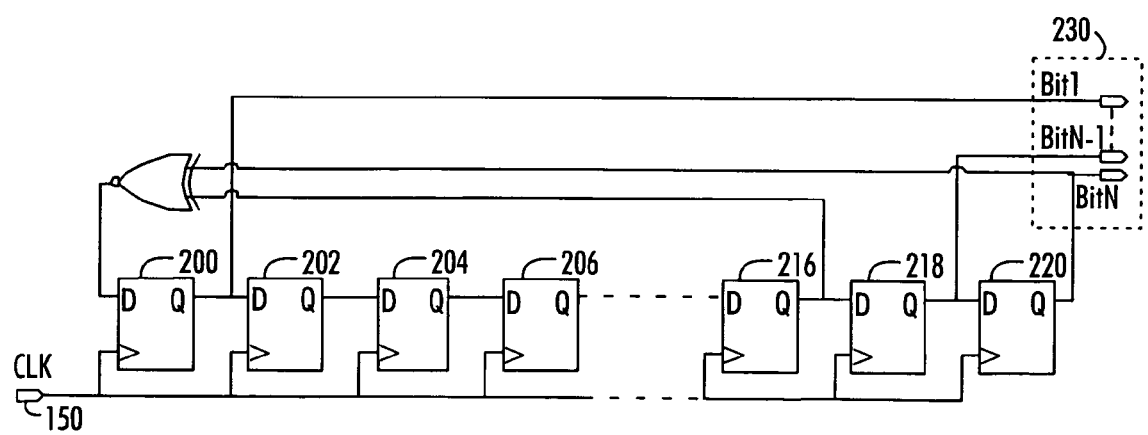
FIG. 2 illustrates an example of a pseudo random number generation block.

FIG. 2 illustrates an example of a pseudo random number generation block (N-bit linear feedback shift register, LFSR, with synchronized clock pulse). It comprises an n-bit stage of shift registers 200 to 220 in series connected by feedback via an exclusive-or the input of which is connected from certain flip-flops' output for forming an optimized n-degree polynomial (e.g. an 11-degree polynomial feedback mixed in the example of FIG. 2). This way the bit outputs 230 called bit1 . . . bitN form uniform distribution and all or part of them can be used. In general, the length of the random number generation block can easily be controlled by adding flip-flops, i.e. it can be a general n-bit configuration with programmable switches for configuring its degree and internal routing to produce the most optimal polynomial in different setups.

Figure 3:
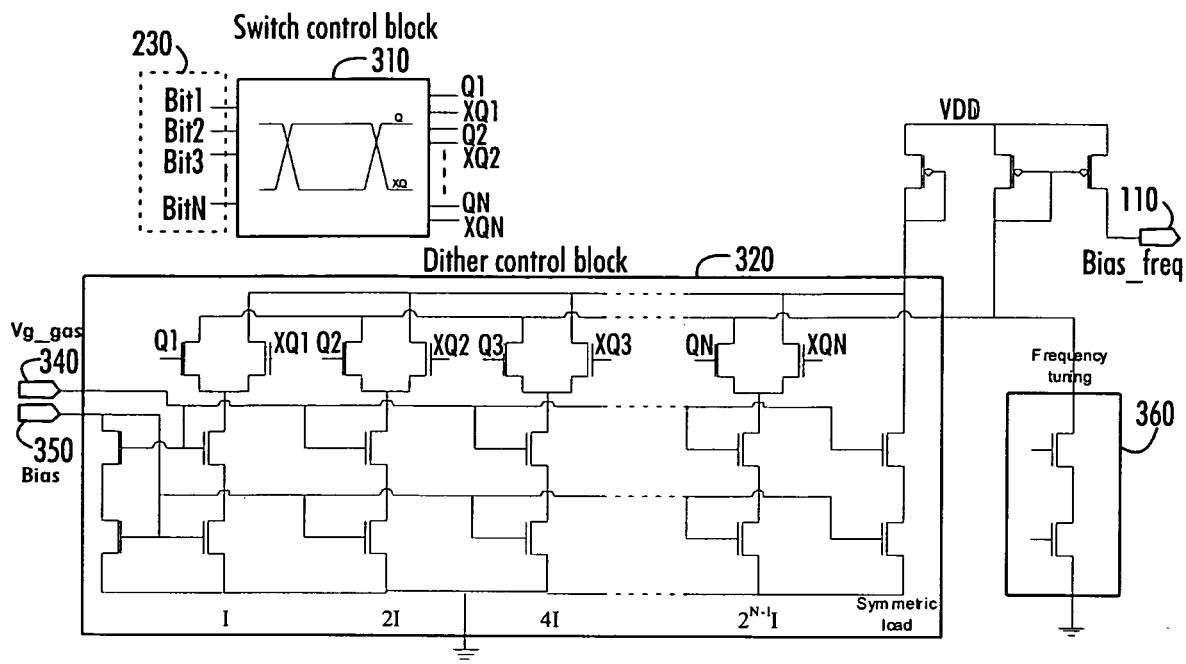
FIG. 3 illustrates an example of dither current insertion into a ramp generator's reference current.

FIG. 3 illustrates an example of dither current insertion into ramp generator's reference current. The last part in dither current generation and summing it into 'Bias_freq' node 110 is described. The output signals bit1 . . . bitN 230 from the LFSR dither block are routed to a switch control block 310, which is an import part to control dither current setting according to formed uniform distribution. The switch control block 310 lets its outputs of Qn/XQn to change in such a way that its complementary output stages are not allowed to conduct simultaneously. Further, at each differential stage of constant current sources in a dither control block 320 change their transistor pairs by minimizing glitches. This enables the reference current of 'Bias freq' 110 to flow most smoothly despite of current added or decreased by current dithering on the top of the default frequency tuning value. All this is important to let the voltage ramp generator produce the most linear output signal and to prevent it from having any significant rapid changes or steps. If any such nonlinearity existed, it would be away from the gain budget available in loop gain, thus decreasing response performance. In current mode converters there can be structures such as unweighted (thermometer coded), binary-weighted or segmented ones (a combination of the previous ones). However, a binary-weighted structure has been used in this example because of area efficiency and simple decoding.

In an embodiment, the default frequency can be set via an external control bus or via some dedicated control structure. However, it can easily be done e.g. via controlled current mirrors. Thus a base current for the frequency setting reference current output, i.e. 'Bias_freq' 110, is produced. Another current setting called 'Bias' node 350 refers to setting dither frequency bandwidth. This can also be done e.g. via controlled current mirrors. The dither control block 320 branch has a symmetric load to settle branch node voltage in order to keep current continuous and its current source biased, especially in such a case when all Qn/XQn pairs are tuning the maximum frequency dither current setting. The 'Vg_cas' voltage 340 refers to the bias voltage for the cascaded stages of the dither control block 320.

Referring to the default frequency tuning, it is also possible that an extra frequency offset tuning 360 is required (default decreased or increased by a certain offset) because of the setting of a feed forward gain of SMPS (in order to tune pass-band ripple of the open-loop gain of SMPS via the ramp generator's swing factor). This can be done easily by using, for example, the same kind of controlled current mirrors as described above, and their programming current is then summed to the reference current of the voltage ramp generator (frequency tuning).

Figure 4:
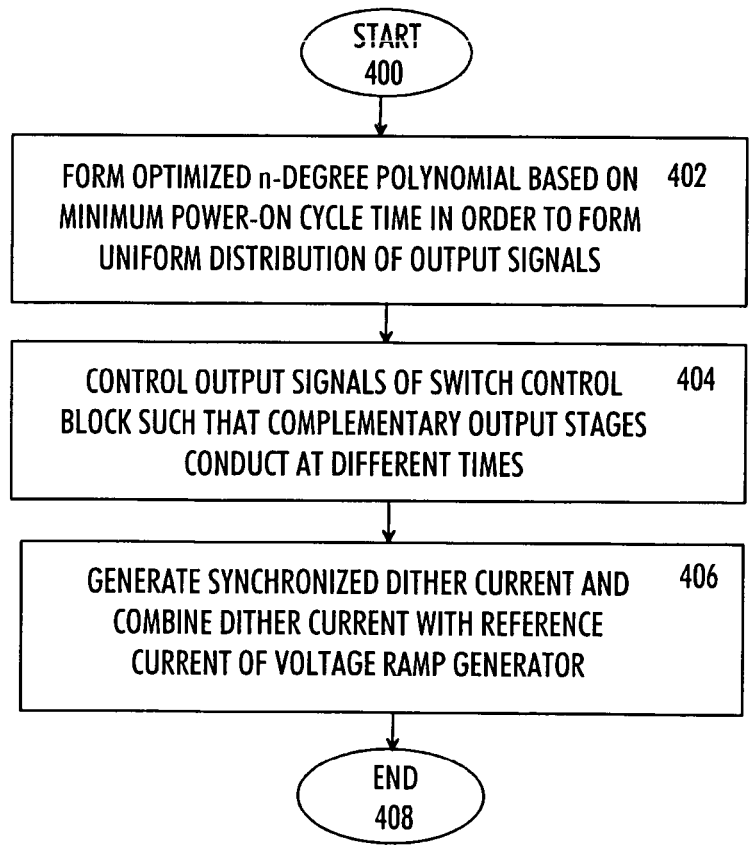
FIG. 4 illustrates a method according to an embodiment.

FIG. 4 illustrates a method according to an embodiment. The method starts in 400. In 402, an optimized n-degree polynomial is formed based on minimum power-on cycle time in order to form a uniform distribution of output signals. A clocked LFSR or any random number generator may be changed at every set operating clock cycle due to reference current changed at synchronized change-over point for keeping the reference current ('Bias_freq') continuous and for sustaining the linearity of the voltage ramp generator.

In 404, output signals of a switch control block are controlled such that the complementary output stages conduct at different times, i.e. not simultaneously, on the basis of the output signals received from the random number generator.

In 406, a synchronized dither current is generated, by a dither control block, by minimizing glitches on each differential stage of a default reference current based on the output signals received from the switch control block, and the generated synchronized dither current is combined with a reference current of a voltage ramp generator. In the method according to an embodiment, the dither current may be inserted into a reference current of the voltage ramp generator of an SMPS by using the described methods of synchronized clocking, switch control block with level control and dither control block with a symmetric load. In this way a dither current can be produced on top of the default operating frequency tuning value, i.e. default reference current setting, which can be produced via controlled current mirrors, for example.

In an embodiment, the dithering function can be enabled all the time. In an embodiment, the functions of the dither control block can be controlled based on at least one of: a modulation scheme of a mobile terminal and a mode of a power amplifier (PA). The dithering can, thus be controlled based on the modulation scheme used (e.g. envelope elimination and restoration, EER, or envelope tracking, ET) or on the PA mode (compressed or linear) and also e.g. based on the exact output voltage. For example, when the output voltage has a certain predetermined value of the maximum value, e.g. 50% of max value, then the depth of the output voltage ripple may be required to change, and thus also the effective dither bandwidth would change.

When dither is not in use, e.g. in GSM EER and PA in saturation mode and SMPS modulates its gain, then the spurious effect is more straight-forward. On the other hand, when PA is in linear mode, the spurious effect on PA's gain is degraded. Thus, the dithering may be controlled in a "high level" in a multimode terminal when the terminal is switched between these different modes. An optimum dithering can be selected for every mode and band because there is a different sensitivity to spurious signals at their supply line.

The method ends in 408.

In an embodiment, programmability of dither frequency bandwidth is enabled for instance via controlled current mirrors for producing a bias current of the dither control block.

In an embodiment, the dither current generation is system independent (either GSM or WCDMA from RF point of view but for any load setups) by uniform distribution when a degree of polynomial is set based on the minimum power-on cycle-time (i.e. the number of bits in LFSR is thus known).

In an embodiment, in addition to default frequency setting, feed forward gain setting of an SMPS may require a reference current ('Bias_freq') setting to be tuned by a certain offset frequency (either current increment or decrement).

In an embodiment, reducing ripple voltage measurable at the output voltage of a switched mode power supply is enabled, and a switching frequency may be programmed by software via an external control bus or can be hardware-coded even inside a switcher. Also using some external control structures is possible, e.g. some dedicated external pin-like reference current setting.

In an embodiment, high frequency and synchronized dither current generation and insertion for sustaining the linearity of a voltage ramp generator is provided. In an embodiment, frequency can be changed in every clock period. This enables working continuously in such a way that there is no need to optimize to a specific system, such as GSM but it can also be used in WCDMA, for example. Clocked LFSR can be changed at every set operating clock cycle due to reference current changed at the synchronized change-over point for keeping reference current continuous, and thus LFSR does not need oscillators of its own. This structure is not bound by any specific ramp generator implementations because the reference current is dithered by minimizing glitches that may be present during the current change period, i.e. higher or lower frequency takes place (and current flow direction switches change their position).

In an embodiment, easy programming is possible, thus enabling tuning so called effective dither bandwidth, i.e. basic frequency plus maximum dithering frequency on top of it. With such a procedure, an embodiment can also be used in such SMPS applications in which a changed load condition (on used PA, PA mode, TX band, TX power level, PA's bias current, or in general level changed load condition) or supply voltage mode of SMPS requires first of all dither function to be enabled and secondly this enabled dither bandwidth tuning possibility for handling spurious energy spread more widely than just a single default. The length of a dither random generation block can be easily controlled by adding stages, i.e. it can also be a general n-bit configuration with programmable switches for configuring its degree and internal routing, thus producing the most optimal polynomial in different setups.

The embodiments of the invention may be realized in a control circuit. The control circuit may be configured to perform at least some of the steps described in connection with the flowchart of FIG. 4 and in connection with FIGS. 1 to 3. The control circuit according to an embodiment can be implemented in a multimode mobile terminal, for example. The mobile terminal may comprise a processing unit configured to control the function of the dither control block based on at least one of: a modulation scheme of the mobile terminal and a mode of a power amplifier of the mobile terminal. The embodiments may be implemented as a computer program comprising instructions for executing a computer process comprising: forming an optimized n-degree polynomial based on the minimum power-on cycle time in order to form a uniform distribution of output signals; controlling the output signals of the switch control block such that the complementary output stages conduct at different times on the basis of the output signals received from the random number generator; and generating a synchronized dither current by minimizing glitches at each differential stage of a default reference current based on the output signals received from the switch control block, and combining the generated synchronized dither current with a reference current of a voltage ramp generator.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, and computer readable printed matter.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus, comprising:
a random number generator configured to form an optimized n-degree polynomial based on a minimum power-on cycle time in order to form a uniform distribution of output signals;
a switch control block configured to control output signals of the switch control block such that complementary output stages conduct at different times on the basis of the output signals received from the random number generator; and
a dither control block configured to generate a synchronized dither current by minimizing glitches at each differential stage of a default reference current based on the output signals received from the switch control block, and to combine the generated synchronized dither current with a reference current of a voltage ramp generator.

2. The apparatus of claim 1, further comprising: a comparator block configured to generate a synchronizing signal on the basis of reference voltage levels from the voltage ramp generator, the synchronizing signal being used to generate a clocking pulse during the highest or lowest level at the voltage ramp generator output at the rate of a switching frequency.

3. The apparatus of claim 1, wherein the random number generator is further configured to change frequency at every set operating clock cycle due to the reference current changed at a synchronized change-over point for sustaining the linearity of an output voltage of the voltage ramp generator.

4. The apparatus of claim 1, wherein the length of the random number generator is controlled by adding flip-flops for generating the most optimal polynomial.

5. The apparatus of claim 1, wherein the default reference current is set via at least one of: an external control bus, a dedicated control structure, and controlled current mirrors.

6. The apparatus of claim 1, wherein the default reference current setting is further tuned by a predetermined offset frequency.

7. The apparatus of claim 1, wherein the switch mode power supply is configured to feed a power amplifier and a processing block, the processing block being configured to control the function of the dither control block based on at least one of: a modulation scheme of a mobile terminal and a mode of the power amplifier.

8. The apparatus of claim 1, wherein the apparatus comprises a control circuit for a switch mode power supply.

9. A method comprising:
forming, by a random number generator, an optimized n-degree polynomial based on a minimum power-on cycle time in order to form a uniform distribution of output signals;
controlling output signals of a switch control block such that complementary output stages conduct at different times on the basis of the output signals received from the random number generator; and
generating, by a dither control block, a synchronized dither current by minimizing glitches at each differential stage of a default reference current based on the output signals received from the switch control block, and combining the generated synchronized dither current with a reference current of a voltage ramp generator.

10. The method of claim 9, further comprising:
generating a synchronizing signal on the basis of reference voltage levels from the voltage ramp generator, the synchronizing signal being used to generate a clocking pulse during the highest or lowest level at the voltage ramp generator output at the rate of a switching frequency.

11. The method of claim 9, further comprising:
changing, by the random number generator, frequency at every set operating clock cycle due to the reference current changed at a synchronized change-over point for sustaining the linearity of an output voltage of the voltage ramp generator.

12. The method of claim 9, further comprising:
controlling the length of the random number generator by adding flip-flops for generating the most optimal polynomial.

13. The method of claim 9, further comprising:
setting the default reference current via at least one of an external control bus, a dedicated control structure, and controlled current mirrors.

14. The method of claim 9, further comprising:
tuning the default reference current setting by a predetermined offset frequency.

15. The method of claim 9, further comprising:
the switch mode power supply feeding a power amplifier and a processing block, the processing block controlling the function of the dither control block based on at least one of: a modulation scheme of a mobile terminal and a mode of the power amplifier.

16. A multimode mobile terminal, comprising:
a random number generator configured to form an optimized n-degree polynomial based on a minimum power-on cycle time in order to form a uniform distribution of output signals;
a switch control block configured to control output signals of the switch control block such that complementary output stages conduct at different times on the basis of the output signals received from the random number generator; and
a dither control block configured to generate a synchronized dither current by minimizing glitches at each differential stage of a default reference current based on the output signals received from the switch control block, and to combine the generated synchronized dither current with a reference current of a voltage ramp generator.

17. The mobile terminal of claim 16, further comprising:
a processing unit configured to control the function of the dither control block based on at least one of a modulation scheme of the mobile terminal and a mode of a power amplifier of the mobile terminal.

18. A non-transitory computer-readable program distribution medium encoding a computer program of instructions being configured to control a processor to perform:
forming an optimized n-degree polynomial, using a random number generator, based on the minimum power-on cycle time in order to form a uniform distribution of output signals;
controlling output signals of a switch control block such that complementary output stages conduct at different times on the basis of the output signals received from the random number generator; and
generating a synchronized dither current by minimizing glitches at each differential stage of a default reference current based on the output signals received from the switch control block, and combining the generated synchronized dither current with a reference current of a voltage ramp generator.

19. The non-transitory computer-readable medium of claim 18, further comprising instructions for: generating a synchronizing signal on the basis of reference voltage levels from the voltage ramp generator, the synchronizing signal being used to generate a clocking pulse during the highest or lowest level at the voltage ramp generator output at the rate of a switching frequency.

20. The non-transitory computer-readable medium of claim 18, further comprising instructions for: changing, by the random number generator, frequency at every set operating clock cycle due to the reference current changed at a synchronized change-over point for sustaining the linearity of an output voltage of the voltage ramp generator.

21. The non-transitory computer-readable medium of claim 18, comprising at least one of the following media a program storage medium, a record medium, a computer readable memory, a computer readable software distribution package, a computer readable signal, a computer readable telecommunications signal, and a computer readable compressed software package.

22. The non-transitory computer-readable medium of claim 21, further comprising instructions for:
controlling the function of the dither control block based on at least one of a modulation scheme of a mobile terminal and a mode of a power amplifier.

23. An apparatus, comprising:
random number generator means for forming an optimized n-degree polynomial based on the minimum power-on cycle time in order to form a uniform distribution of output signals;
switch control means for controlling output signals of the switch control means such that complementary output stages conduct at different times on the basis of the output signals received from the random number generator; and dither control means for generating a synchronized dither current by minimizing glitches at each differential stage of a default reference current based on the output signals received from the switch control block, and for combining the generated synchronized dither current with a reference current of a voltage ramp generator.

24. The apparatus of claim 23, further comprising:

comparator means for generating a synchronizing signal on the basis of reference voltage levels from the voltage ramp generator, the synchronizing signal being used to generate a clocking pulse during the highest or lowest level at the voltage ramp generator output at the rate of a switching frequency.

25. The apparatus of claim 23, wherein the random number generator means further change frequency at every set operating clock cycle due to the reference current changed at a synchronized change-over point for sustaining the linearity of an output voltage of the voltage ramp generator.

26. The apparatus of claim 23, wherein the apparatus comprises a control circuit for a switch mode power supply.

* * * * *